United States Patent [19]
Simmons et al.

[11] Patent Number: 5,462,217
[45] Date of Patent: Oct. 31, 1995

[54] HIGH FORCE COMPRESSION FLIP CHIP BONDING SYSTEM

[75] Inventors: Richard L. Simmons, Jonestown; Michael J. Bertram, Dripping Springs, both of Tex.

[73] Assignee: Microelectronics and Computer Technology Corporation, Austin, Tex.

[21] Appl. No.: 306,548

[22] Filed: Sep. 15, 1994

Related U.S. Application Data

[62] Division of Ser. No. 112,494, Aug. 25, 1993, Pat. No. 5,368,217.

[51] Int. Cl.⁶ .................. B23K 20/02; H01L 21/603
[52] U.S. Cl. ..................... 228/180.22; 228/235.1
[58] Field of Search ............ 228/180.22, 234.1, 228/235.1, 6.2, 44.7, 49.5, 105

[56] References Cited

U.S. PATENT DOCUMENTS

| | | | |
|---|---|---|---|
| T955,008 | 2/1977 | Gregor et al. | 357/80 |
| 4,670,770 | 6/1987 | Tai | 357/60 |
| 4,749,120 | 6/1988 | Hatada | 228/123 |
| 4,768,702 | 9/1988 | Takahashi et al. | 228/44.7 |
| 4,875,614 | 10/1989 | Cipolla et al. | 228/44.7 |
| 4,899,921 | 2/1990 | Bendat et al. | 228/6.2 |
| 4,926,241 | 5/1990 | Carey | 357/75 |
| 4,945,954 | 8/1990 | Wehrly, Jr. et al. | 140/105 |
| 4,949,148 | 8/1990 | Bartelink | 357/74 |
| 4,982,890 | 1/1991 | Schuster et al. | 228/44.7 |
| 5,072,874 | 12/1991 | Bertram et al. | 228/264 |
| 5,150,827 | 9/1992 | Fries | 228/44.7 |
| 5,197,650 | 3/1993 | Monzen et al. | 228/6.2 |
| 5,285,946 | 2/1994 | Tomigashi et al. | 228/6.2 |

*Primary Examiner*—Samuel M. Heinrich
*Attorney, Agent, or Firm*—Baker & Botts

[57] ABSTRACT

A high force flip chip bonding method and system that precisely and forcefully engage a flip chip device with a corresponding wiring pattern on a substrate in a manner that prevents flip chip device and substrate shifting during force application. The method includes the steps of determining the centroid of the pattern formed by the interconnects on the flip chip device. The flip chip device is directed toward the substrate for contacting the corresponding wiring pattern with the interconnects and then the interconnects are compressed into the corresponding wiring pattern using a bonding force. The bonding force is directed along a neutral axis of deflection that is coincident with the centroid. Applying the bonding force along the neutral axis of deflection at the centroid minimizes lateral shifting of the flip chip device relative to the substrate to precisely bond the interconnects to the corresponding wiring pattern.

14 Claims, 4 Drawing Sheets

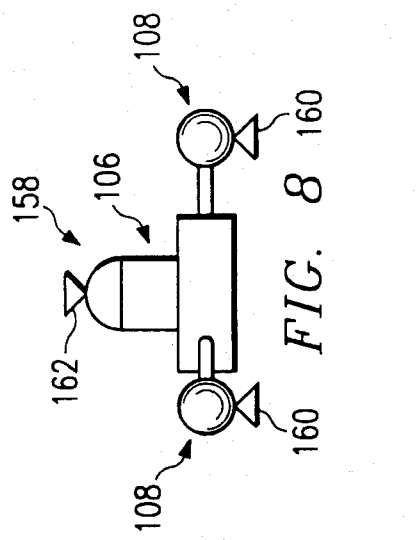
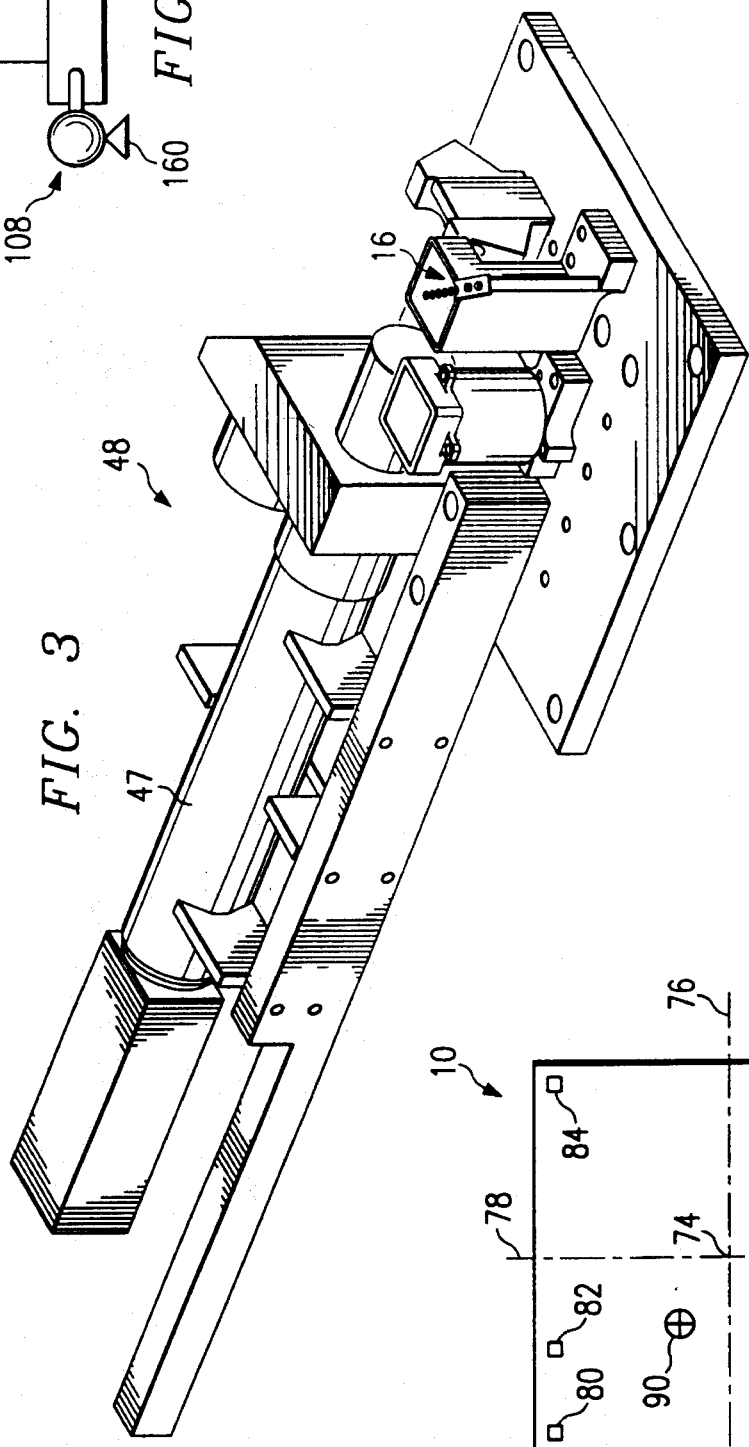
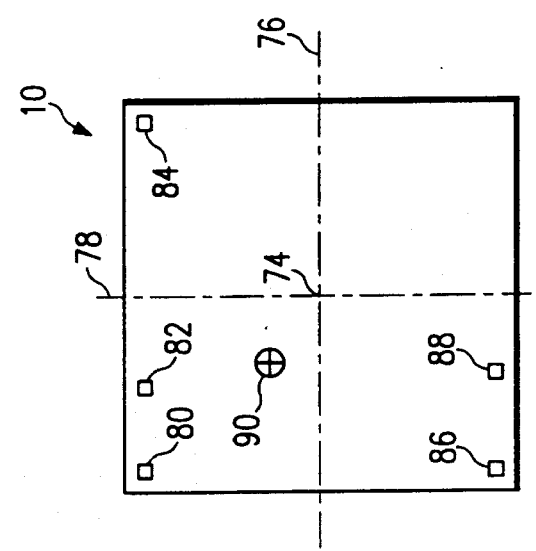

HIGH FORCE COMPRESSION FLIP CHIP BONDING SYSTEM

CROSS REFERENCE TO RELATED APPLICATIONS

This application is a divisional application of U.S. application Ser. No. 08/112,494, filed Aug. 25, 1993 and entitled "High Force Compression Flip Chip Bonding Method and System", now U.S. Pat. No. 5,368,217.

TECHNICAL FIELD OF THE INVENTION

The present invention generally relates to electronic circuit fabrication devices and, more particularly, to a high force compression flip chip bonding method and system that provides high force compression and precise placement and alignment of flip chip device interconnects with a corresponding wiring pattern on a substrate to improve the bonds of the flip chip device interconnects to the corresponding wiring pattern.

BACKGROUND OF THE INVENTION

Manufacturers of integrated circuit devices often form on a single silicon wafer numerous separate integrated circuits. The silicon wafer is then cut into integrated circuit devices, commonly referred to as "chips." The chips may be packaged either separately or as part of a multi-chip module for further connection to other electronic and electrical devices. For any such chip, numerous exposed interconnects form important communication paths between the chips and other devices.

One type of integrated circuit device that uses numerous interconnects has the name of a "flip chip" device due to its packaging orientation being flipped or inverted when compared to more traditional chip packaging designs. Part of the flip chip device packaging process is to bond its interconnects with a corresponding wiring pattern on a substrate. One approach to bonding flip chip device interconnects to the substrate entails their "cold" or low temperature compression into the substrate.

In bonding flip chip devices to substrates by compression, it is necessary to determine the minimum amount of compressive force. As the number of interconnects have increased due to circuit components becoming smaller and more compact, packaging requirements have changed. For example, an increasing number of interconnects requires that the amount of force that the flip chip device receives must increase in order for each interconnect to receive its necessary allotment of the total compressive force. An increased number of interconnects also mandates improved alignment and placement of the flip chip interconnects with the corresponding wiring pattern of the substrate. In addition, more interconnects per unit area requires a more even distribution of the bonding force across the flip chip device surface. For example, in an increasing number of instances as much as 100 pounds of precisely aligned, evenly distributed force is necessary to bond the interconnects of a flip chip device. As circuit densities increase so that placement accuracy requirements fall below the three micron regime and into the one micron regime and below, the requirement for placement accuracy becomes even more important.

Known high force compression force flip chip bonding methods and systems cannot achieve this degree of accuracy and uniformity at these high pressures. In these approaches to flip chip interconnect bonding, not only is the total force a problem, but also these systems have inherent displacement or misalignment problems. No present system for high force compression flip chip bonding overcomes these limitations.

Consequently, there is a need for a high force compression force flip chip bonding method and system that can reach 100 pounds force and beyond (e.g., 300 pounds), as well as satisfy placement alignment tolerances associated with interconnects for circuit densities of three microns and below.

There is yet a further need for a high force compression force bonding method and system for flip chip devices that avoid lateral (horizontal) shifting during compression such as that which occurs in conventional high force compression bonding methods and systems.

There is a further need for a method and system of high force compression bonding for flip chip devices that distribute the compression force uniformly across the flip chip device so that all interconnects in the same plane receive a relatively equal amount of the compression force.

SUMMARY OF THE INVENTION

The present invention, accordingly, provides a high force compression force flip chip bonding method and system and overcomes or reduces disadvantages and limitations associated with prior compression systems and methods for flip chip interconnect bonding.

One aspect of the invention is a high force flip chip bonding method that precisely and forcefully engages interconnects of a flip chip device with a corresponding wiring pattern on a substrate in a manner that prevents lateral shifting therebetween during force application. The method includes the steps of determining the centroid of the pattern formed by the interconnects on the flip chip device. In an alternative embodiment a predetermined point other than the centroid may be selected to achieve certain bonding results. A next step is to direct the flip chip device toward the substrate for contacting the corresponding wiring pattern with the interconnects. Then, the method steps include compressing the interconnects into the corresponding wiring pattern using a bonding force. The bonding force is directed along a neutral axis of deflection that is coincident with the centroid or other predetermined point. Applying the bonding force along the neutral axis of deflection at the centroid or other predetermined point minimizes lateral shifting of the flip chip device relative to the substrate to precisely bond the interconnects to the corresponding wiring pattern.

As used herein, the term "neutral axis of deflection" means the axis at which engineering stress and strain, considering all force, is essentially zero. The term "flip chip device" means any electronic or electrical device in which the interconnects are flipped to face and contact a corresponding wiring pattern on a substrate. The term "interconnects" includes electrical, as well as mechanical connections between the flip chip device and the substrate.

A technical advantage of the present invention is that it achieves high compressive forces with placement alignment that is sufficiently high to bond interconnects of flip chip devices having circuit densities requiring placement accuracies of three microns. Based on the tolerances of the present invention, three micron regime alignment and placement accuracies occur readily. The present invention can employ even tighter tolerances that also make interconnect bonding in the one micron regime practical. Another technical advantage is that the method and system of the present invention apply the interconnect bonding force axially instead of in cantilever fashion. Known interconnect cold compression devices apply their compressive force through a cantilever structure. Applying the compressive force axially through the neutral axis of deflection, on the other hand, helps to eliminate placement and alignment variations that are inherent to cantilever force application.

A further technical advantage of the present invention is that it employs a spherical bearing system as part of the bond head positioner. This insures even further accuracy in placing the flip chip device precisely in the desired position and maintains planarization of the flip chip device during placement.

Yet a further technical advantage is that the present invention applies the compressive force through the planar area centroid of the interconnect positions on the flip chip device. This markedly enhances the uniformity of force distribution across the flip chip device. Additional technical advantages of the present invention include the fact that in the preferred embodiment the bond head is easily replaceable. This is due to the pneumatic and electrical connections that the preferred embodiment employs. Also, the preferred embodiment includes a non-volatile memory cell that permits self-identification of the flip chip device position. This is one of the various parameters that is important to the proper functioning of the bond head. This helps to maintain proper positioning of the flip chip device during interconnect compression.

BRIEF DESCRIPTION OF THE DRAWINGS

The invention and its modes of use and advantages are best understood by referring to the following description of illustrative embodiments when read in conjunction with the accompanying drawings, wherein:

FIG. 3 shows an isometric view of a carriage device for positioning the substrate relative to the flip chip device in the XY plane;

FIG. 6 conceptually illustrates application of the compressive force through the planar centroid according to the present embodiment;

FIG. 8 is a free body diagram of a force transmitting element within the theta stage device of FIG. 7.

DETAILED DESCRIPTION OF THE INVENTION

The preferred embodiment of the present invention is best understood by referring to the FIGUREs wherein like numerals are used for like and corresponding parts of the various drawings.

The present invention provides a method and apparatus for placing and aligning a flip chip device to perform high force flip chip interconnect bonding. The present embodiment involves the use of a four-post die set as the main structural element to minimize detrimental deflections or changes in the relative positions between the flip chip device and the substrate. The system incorporates a lockable self-planarizing bond head that has a three-dimensional center of rotation and includes a spherical bearing. The spherical bearing positions the neutral axis of deflection of a frame transmitting the bonding force at the centroid of the interconnects of the flip chip device. The targeting features for alignment of the flip chip device with the substrate are performed at the same nominal Z-axis position so as to minimize the undesired effects of X- and Y-axis run-out on the Z-axis stage. The bond head design and its method of application help insure that the bonding process does not affect the resulting position of the flip chip device and the substrate during the application of large compressive forces.

Figure 1A:
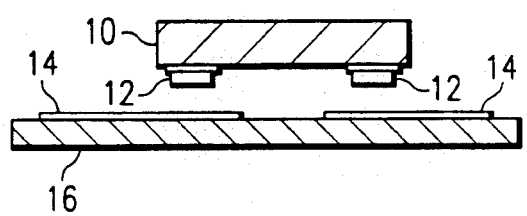
FIGS. 1a and 1b show placing interconnects of a flip chip device in contact with a corresponding wiring pattern of a substrate to illustrate the environment of the present embodiment.
Figure 1B:
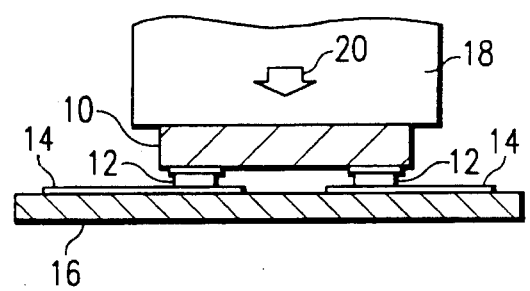

In FIGS. 1a and 1b the environment of the invention appears to illustrate the placement of flip chip device 10 having interconnects 12 in contact with the corresponding wiring pattern 14 of substrate 16. According to the present embodiment flip chip device 10 is held by end effector 18 and adjusted to be in correspondence with wiring pattern 14 of substrate 16. Flip chip interconnects 12 are pressed against wiring pattern 14 by downward movement of end effector 18 in the direction of arrow 20. By this pressure is applied in the direction of arrow 20, flip chip interconnects 12 and wiring pattern 14 are electrically and mechanically connected. Once connected, increased force and, if necessary, slight heat are applied to bond flip chip interconnects 12 to corresponding wiring pattern 14. After flip chip interconnects 12 bond to corresponding wiring pattern 14, the bonding force and slight heat are removed. The present embodiment addresses numerous limitations associated with this process and provides a set of solutions to these problems, as hereinafter described.

Figure 2:
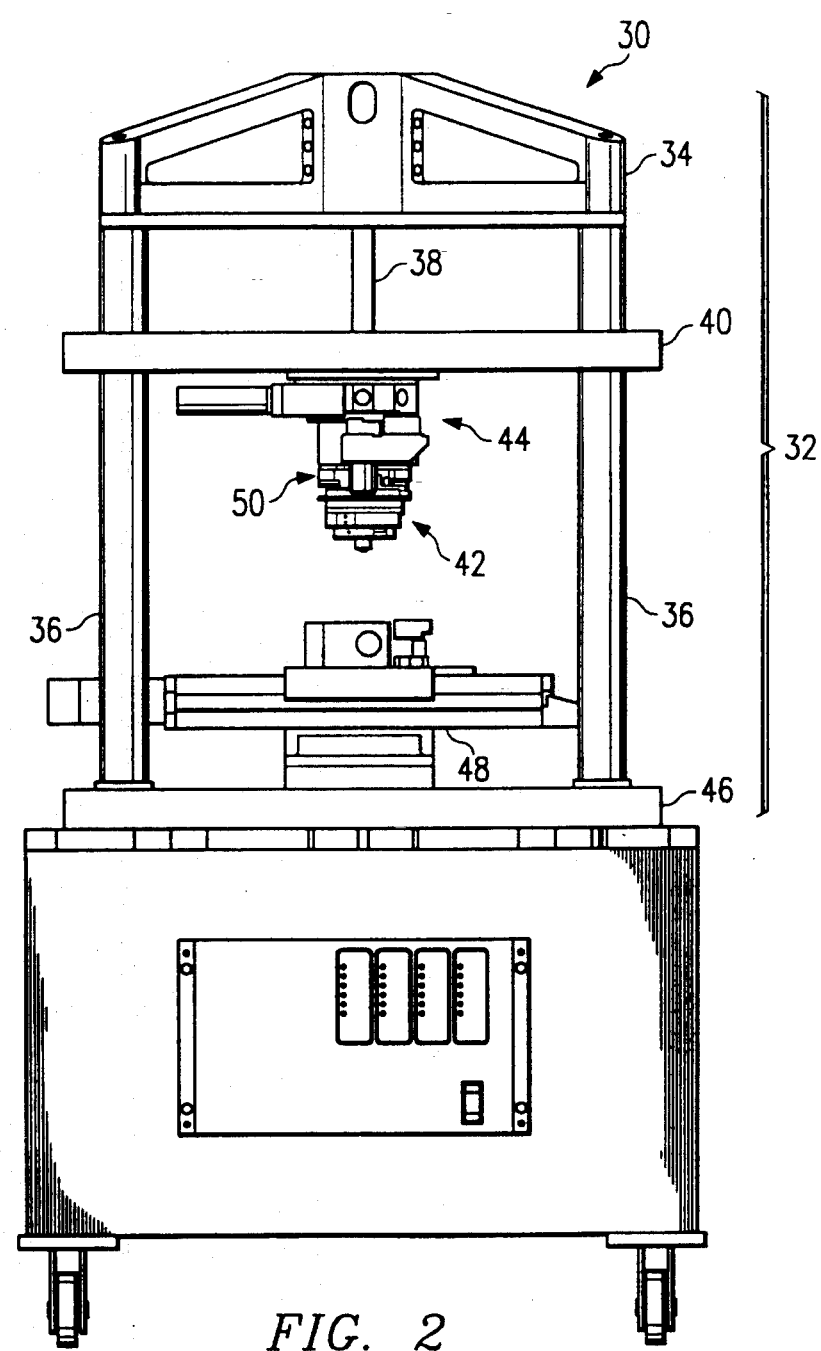
FIG. 2 provides an elevational view of one embodiment of the present invention.

Referring to FIG. 2, high force compression bonding system 30 of the present embodiment includes frame 32 having upper housing 34 to which outer posts 36 and central force actuator 38 attach. Upper die shoe 40 engages central force actuator 38 and slidably engages four outer posts 36. Bond head 42 attaches to theta stage device 44 and holds flip chip device 10 on end effector 18 through a vacuum or other fixing force. Outer posts 36 engage lower die shoe 46 to which carriage 48 attaches. Also referring to FIG. 3, the XY position of flip chip device 10 relative to substrate 16 may be controlled by carriage 48 that adjusts substrate 16, while flip chip device 10 remains fixed in its XY position. On the other hand, flip chip device 10 may be moved relative to a fixed-position substrate by placing a similar translation device on upper die shoe 40. The present embodiment minimizes deflection of bond head 42 upon application of an axial bonding force to flip chip substrate 16 on carriage 48. As a result, the present embodiment achieves the objectives of accurately placing flip chip device 10 on substrate 16 as well as avoiding lateral shifting of their relative position during interconnect bonding.

One aspect of the invention is to keep flip chip device 10 in position during bonding by minimizing off-axis lateral forces on substrate 16 during application of the bonding force. End effector 18 and carriage 48, respectively, hold flip chip device 10 and substrate 16, through use of a vacuum. Keeping off-axis and lateral forces minimal during force application minimizes position changes during bonding to the point that the holding force due to these respective vacuums or other holding means is sufficiently large to maintain their relative positions. The planarizing or leveling forces on flip chip device 10 are centered about the area centroid of the flip chip interconnects 12 on the flip chip device 10. The Z-axis dimensions of end effector 18 are designed so that the Z-center of the spherical bearing (see FIGS. 4a, 4b and 5 below), within bond head 42 is at the interface plane of the flip chip interconnects 12 between flip chip device 10 and substrate 16. This also maintains the centering of the leveling forces on flip chip device 10.

Figure 4A:
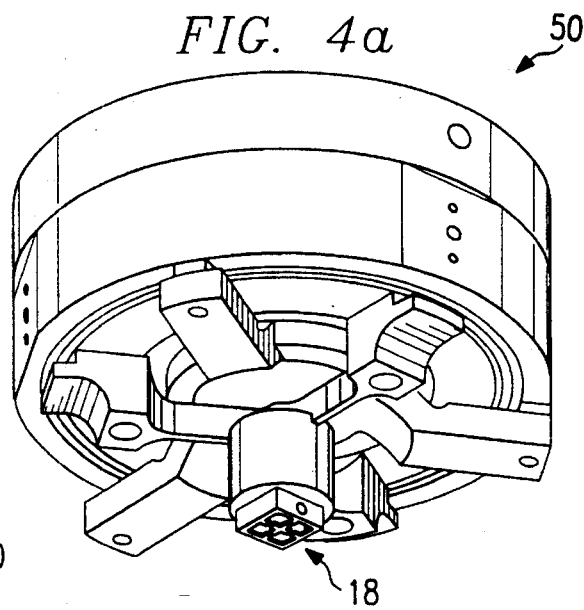
FIGS. 4a and 4b show an isometric view and a plan view, respectively, of a spherical bearing that the present embodiment of the invention employs.
Figure 4B:
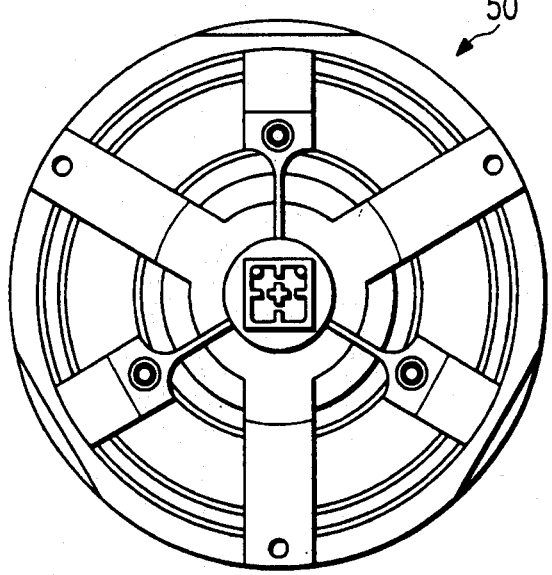
Figure 5:
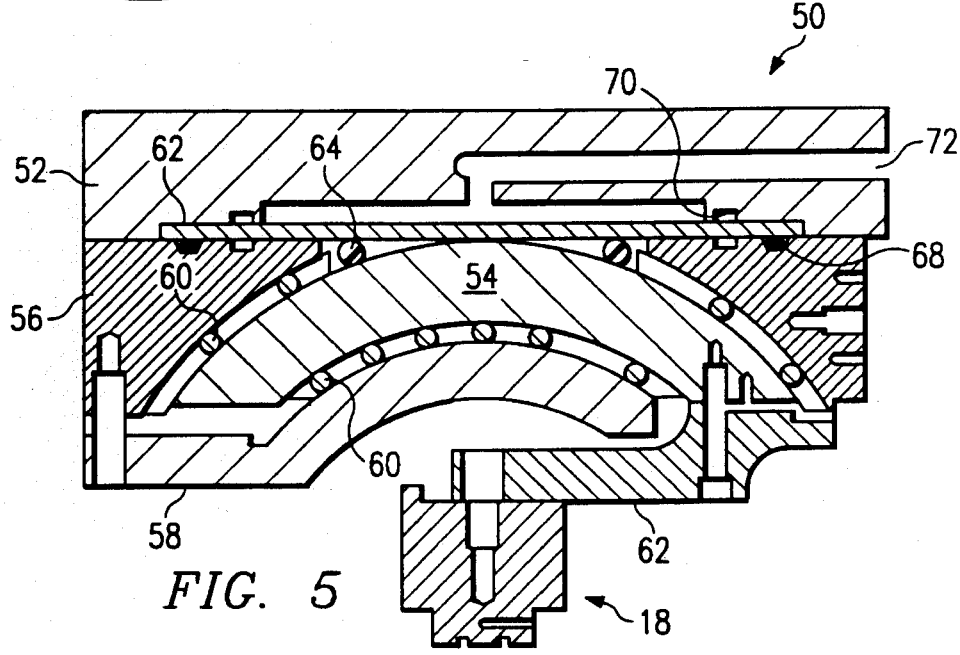
FIG. 5 provides a cross-sectional view of the spherical bearing of FIGS. 4a and 4b.

FIG. 4a shows an isometric view of spherical bearing 50 within bond head 42 of the present invention. FIG. 4b shows a plan view, and FIG. 5 provides a cross-sectional view of spherical bearing 50. Flip chip device 10 attaches to end effector 18 by way of vacuum or some other restraining method. End effector 18 is attached to the thermal isolator 52 which attaches to dual spherical surface bearing element 54. Dual spherical surface bearing element 54 is restrained between lower spherical race 58 and the upper spherical race 56 by bearing balls 60. This allows end effector 18, thermal isolator 52, and dual spherical surface bearing element 54 to rotate in all directions about a common center to all the spherical bearing surfaces. Brake disk 62 is held in XY position relative to dual spherical surface bearing element 54 with a minimum constraint design of three bearing balls 68 constrained between conical indentations in upper spherical race 56 and conical indentations in brake disk 62. Brake cap 52 is attached to the upper spherical bearing race 56 and constrains brake disk 62 against the minimum constraint three ball bearings arrangement 68.

Sealing rings 70 are clamped between brake disk 62 and upper spherical race 56 and also between brake disk 62 and brake cap 52. Elastic brake ring 64 is adhesively attached to the face of brake disk 62 in order to restrain the dual spherical surface bearing element 54 against rotation about the Z-axis. If elastic brake ring 64 were not implemented, then there would only be point contact between brake disk 62 and dual spherical surface bearing element 54. A point contact in this configuration, however, cannot stop the dual spherical surface bearing element 54 from rotating about the Z-axis. When pneumatic pressure is applied to port 72 the pressure is also applied to the chamber created between brake disk 62 and brake cap 52. This pressure causes brake disk 62 to deflect toward the dual spherical surface bearing element 54 and for elastic brake ring 64 to come into contact with dual spherical surface bearing element 54, thereby locking it in position in all axes of rotation. End effector 18 is designed for each replacement to accommodate differing flip chip device 10 outline dimensions as well as accommodating a physically different interconnect centroid and/or bond die thickness.

FIG. 6 conceptually illustrates one aspect of the operation of spherical bearing 50. In the event that the interconnect centroid of flip chip device 10 is at the geometric center of the device the situation is simple. However, often the interconnect pattern of flip chip device is not symmetric about one or both of the device center lines. This is shown in the interconnect centroid example of FIG. 6. Referring to FIG. 6, there appears flip chip device 10 that has the form of a square, for example, that is symmetric about flip chip center 74 that X-axis cross-hair 76 and Y-axis cross-hair 78 establish. On flip chip device 10 five interconnects 12 particularly numbered 80, 82, 84, 86 and 88. Interconnects 80, 82, 84, 86 and 88 are asymmetric about flip chip center 74. Centroid 90, however, is the planar area centroid for these interconnects. The present embodiment provides uniformity in high force compression of interconnects 80, 82, 84 86, and 88, for example, by positional calibration about centroid 90.

The calculation to find centroid 90 of an irregular interconnect array having the planar origin or center ($X_c, Y_c$) uses the following equations:

$$X_c = \frac{(A_1X_1 + A_2X_2 + A_3X_3 + \ldots + A_nX_n)}{\sum_{i=1}^{N} A_i} \quad (1)$$

$$Y_c = \frac{(A_1Y_1 + A_2Y_2 + A_3Y_3 + \ldots + A_nY_n)}{\sum_{i=1}^{N} A_i} \quad (2)$$

Where $A_1, \ldots, A_n$ represents a weighting coefficient associated with the relative size of the interconnect and ($X_i, Y_i$), $i=1,\ldots, n$, represents a position in the XY-plane relative to flip chip center 74.

It should be noted that the present invention may also apply a controlled non-uniformity of pressure to interconnects 12, i.e., a designed difference in pressure between individual interconnects as may be desirable in certain applications.

Figures 7, 7A, 7B:
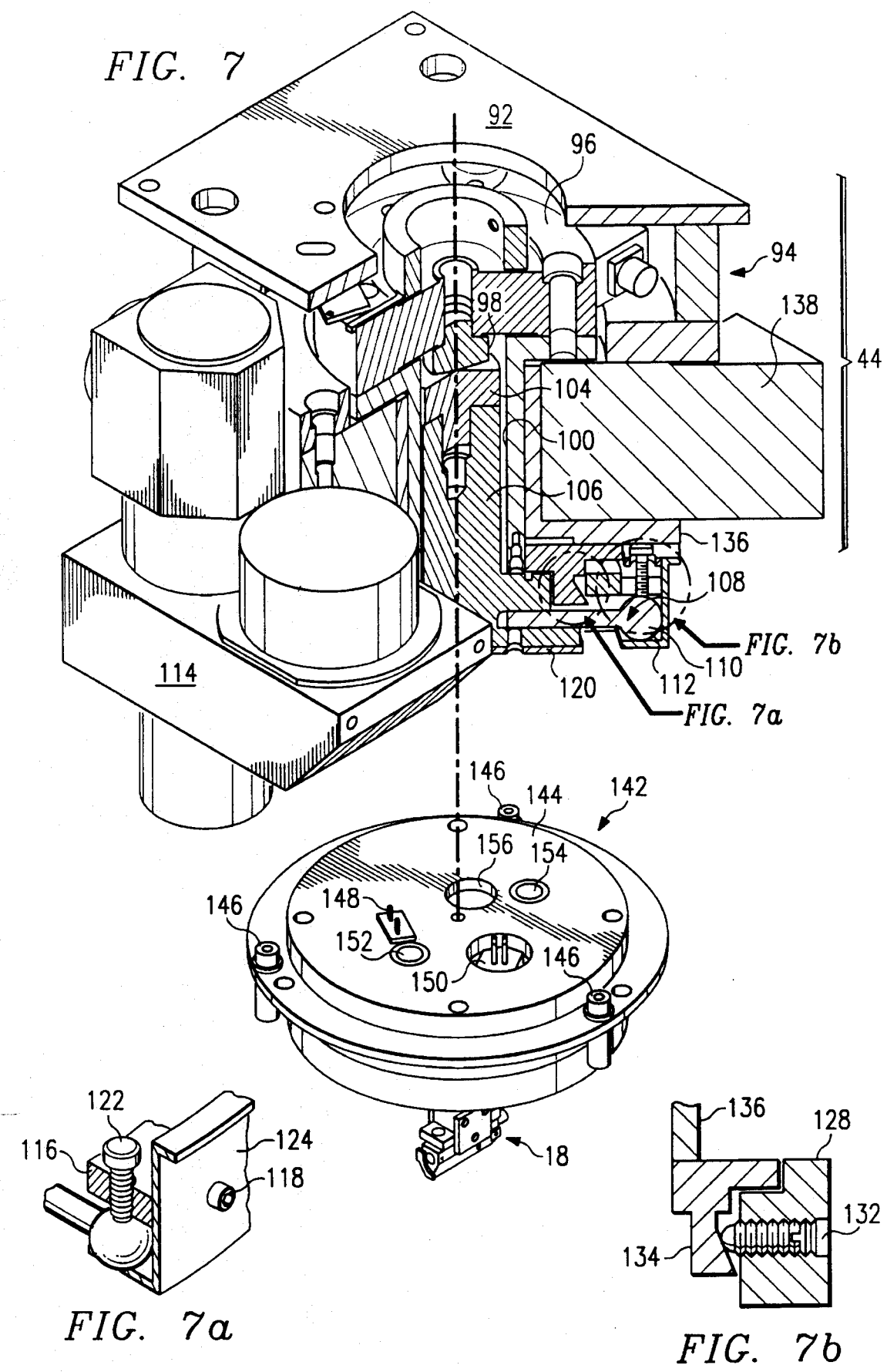
FIG. 7 is an isometric view of a theta stage device of the present embodiment.
FIGS. 7a and 7b show an isometric view and a plan view, respectively, of a portion of the theta stage device of FIG. 7.

An important aspect of the present embodiment is the ability to avoid significant rotational variations about a central axis such as centroid 90. This further assures precise alignment of flip chip interconnects 12 with corresponding wiring pattern 14. In FIG. 7 appears theta stage device 44 on which bond head 42 attaches to achieve this object. Theta stage device 44 includes mounting plate 92 to which casing 94 attaches. Within casing 94 is load cell 96. Load cell 96 provides a downward force through load cell button 98. Load cell button 98 fits within channel 100 and interfaces a spherical surface of force transmission button 104. Force transmission button 104 connects to force transmitting element 106. Force transmitting element 106 connects to three kinematic mounts 108. Each kinematic mount 108 supports force transmitting element 106 and includes spherical portion 110 that rests within channel 112. Also attached to theta stage device 44 is upper camera 114. Upper camera 114 provides a view of substrate 16 relative to theta stage device 44 and, hence, flip chip device 10.

Referring to FIG. 7a, kinematic mounts 108 are fixed at their inner ends to force transmitting element 106 and rest on the bottom surface of wobble adjuster blocks 116. Wobble adjustment blocks 116 of theta stage device 44 are adjusted vertically by hex cap screw 122. This adjustment also provided so that force transmitting element 106 can be brought into intimate contact with load cell button 98 of load cell 96. This adjustment also minimizes the wobble of the bond head mounting plate 120. Wobble is defined herein to mean the possible nutating motion of the face of the bond head mounting plate 120. Wobble adjustment block 116 is locked in place by cap screws 122 through run-out plate 124 and wobble adjuster block 116 and at right angles to the adjustment screws 128. Wobble adjustment blocks 116 are attached to centering ring 128 with cap screws 130.

Referring to FIG. 7b, ball-nose set screws 132 in centering ring 128 constrain centering ring 128 to tapered flange 134. Ball-nose set screws 132 allow adjustment in centering ring 128 to achieve the proper and correct center of rotation of the assembly made up of centering ring 128, wobble adjustment block 116, run-out plate 124, kinematic mount 108, force transmitting element 106, and ultimately bond head mounting plate 120. Ball-nose set screws 132 and the tapered design of tapered flange 134 act in such a manner as to keep the centering ring 128 pulled up tight against the rotational face plate 136 of the rotary positioner 138.

Force transmitting element 106 is kinematically restrained to provide accurate rotary motion while also transmitting the axial compressive force of the bond process to bear on load cell 96. The kinematic restraint of force transmitting element 106 is accomplished with wobble adjuster blocks 116 providing uplifting force on kinematic mounts 108, and run-out plates 124 defining the XY center, and load cell button 98 providing a downward force equal to the sum of the uplifting forces provided by wobble adjustment blocks 116.

In order to minimize the effects of the kinematic mount of bond head 42, load cell 96 is mounted to and rotated with force tube 140. This helps to ensure that any imperfections in the spherical radii of force transmission button 104 and load cell button 98 do not change the force reading in load cell 96.

From theta stage device 44, bond head mounting plate 120 engages bond head interface component 142. The features of bond head interface component 142 are designed into brake cap 52 (see FIGS. 4a, 4b and 5, above). Theta stage device 44 allows different bond heads to be quickly and conveniently changed because each bond head is aligned, plumbed, and electrically connected by the features built into its associated connection of bond head interface component 142. The accurate alignment of flip chip device 10 to the center line of theta stage device 44 is achieved with the use of a round dowel pin and a diamond shape dowel pin that are both affixed to interface plate 120 of theta stage device 44. The diamond shape dowel pin is oriented so as to accurately set the rotational orientation of the bond head interface component 142 and to make the center line distance between the two dowel pins and their mating dowel bushings less critical.

An attractive aspect of the present embodiment is that bond head interface component 142 includes a variety of easily-made connections to theta stage device 44. These connections include pneumatic vacuum connections 146 that provide the necessary vacuum to hold flip chip device 10 in fixed engagement with end effector 18. End effector 18 has provision for heating and cooling. Additionally, bond head interface component 142 includes thermocouple connection 148, heater/electrical connector 150, and alignment pin bushings 152 and 154. Heater/electrical connection 150 may provide electrical power to a variety of electrical components within bond head interface component 142. Alignment pin bushings 152 and 154 provide necessary alignment points for properly engaging bond head interface component 142 with theta stage device 44.

Touch memory cell 156 provides a non-volatile RAM chip that stores the physical size of each bond head and enables a collision avoiding software algorithm to predict and avoid collisions of the bond head device with other apparatus that may be in the path of the bond head. When the size parameters are accurately entered in touch memory cell 156 for a given bond head, touch memory cell 156 confirms calculations and operator requests to ensure that flip chip device 10, in particular, and bond head 42, in general, will not collide with other devices. Furthermore, touch memory cell 156 provides a non-volatile memory cell that can be used for storing the particular parameters of flip chip device 10 such as the PID (proportional integral differential) temperature control coefficients. One acceptable touch memory cell 156 is that device manufactured by Dallas Semiconductor Corporation of Dallas, Tex. and having the product number DS1991LF5.

An important aspect of the invention is the uniform distribution of compressive force through force transmitting element 106 to bond head interface component 142 and ultimately to flip chip device 10. FIG. 8, to illustrate how the present embodiment achieves this object, shows a free body diagram of force transmitting element 106. In order for the device to apply the compressive force from flip chip device 10 to substrate 16 consistent with the present invention, it is necessary to minimize the displacing effects of friction. Force transmitting element 106 achieves this object by kinematically constraining both upward and downward movement. Referring to FIG. 8, free body diagram 158 includes force transmitting element 106 to which kinematic mounts 108 integrally attach. As stated above in connection with FIG. 7, each of the present embodiment's three kinematic mounts 108 has a spherical portion 110 that rests in channel 112 of wobble adjustment block 116. Channel 112 serves as a stationary platform and provides an upward static force as arrow 160 indicates. Opposing upward movement of force transmitting element 106 is a reaction force from load cell button 98 of load cell 96. This is indicated by the downward static force arrow 162 which contacts spherical surface 102 of force transmitting element 106.

Also attached to theta stage device 44 is upper camera 114. Upper camera 114 provides a view of substrate 16 relative to theta stage device 44 and, hence, flip chip device 10. The use of an upper camera 114 and lower camera assembly 47 (FIG. 3) which is within lower die shoe 46 is an important aspect of the present embodiment. Upper camera 114 attaches to theta stage device 44 in FIG. 7. The upper and lower camera combination make it possible to calculate and rotate theta stage device 44 to the proper position for precise placement of flip chip device 10 and to operate carriage 48 to align substrate 16 in the XY plane. Closed loop servo stages in the present embodiment have a home marker for establishing machine zero for each of the four axis of motion (i.e., X, Y, Z and θ). All of the calibration points for the various elements of the motion system are relative to this repeatable machine zero.

In properly aligning flip chip device 10 and substrate 16 it is necessary to identify the targeting positions on substrate 16 and targeting positions on flip chip device 10. After targeting these positions, it is necessary to bring them together accurately so that flip chip device 10 contacts and then compresses only the necessary interconnects 12 for bonding flip chip device 10 with substrate 16. The present embodiment, therefore, uses a two-camera approach to digitize or identify features on substrate 16 and features on flip chip device 10 that are to come together. After flip chip device 10 comes in direct contact with substrate 16, it is no longer possible to see the entire interconnect pattern. The present embodiment uses the upper camera 114 and lower camera 47 configuration that has a minimum separation from the neutral axis of deflection through which operates theta stage device 44. This minimizes the distance of viewing so that the distance between the perceived or determined position and the actual positions between flip chip device 10 and substrate 16 are kept as small as possible. By carefully controlling the movement in the X,Y, and Z direction as well in the rotational or θ direction through the use of the upper camera and lower camera, it is possible to accurately place the flip chip device 10 in contact with the corresponding wiring pattern on substrate 16.

High force compression bonding system 30, therefore, in the present embodiment is a four-posted die set with outer posts 36 positioned 90° apart from one another an equal distance from the center axis of movement along the Z or vertical direction of upper die shoe 40. As opposed to a cantilever structure, the present embodiment translates the force of upper frame portion 34 through central force actuator 38 to upper die shoe 40. This force then translates along the neutral axis of deflection through bond head 42 to and through end effector 18. End effector 18 holds flip chip device 10 to bond flip chip interconnects 12 to substrate 16. Frame 32 and central force actuator 38 cooperate to form an actuator that has an internal motor in frame 32 for forcing upper die shoe 40 vertically downward along the neutral axis of deflection. As upper die shoe 40 moves downward, flip chip device 10 comes in contact with the wiring pattern 14 of substrate 16. As the downward force increases, the line of action of the force passes through centroid 90 or another predetermined point on flip chip device 10.

The engineering stresses and strains that arise during application of the bonding force through the neutral axis of deflection at centroid 90 pass radially to outer posts 36 and then to lower die shoe 46. From lower die shoe 46, these stresses and strains pass through carriage 48 on which substrate 16 is positioned in place through a vacuum or similar holding arrangement. Thus, as the engineering stresses and strains that arise in bonding flip chip device 10 to substrate 16 increase, the radially symmetric distribution of the force around the present embodiment minimizes lateral shifting between flip chip device 10 and substrate 16.

One of the attractive features of the present embodiment is that it may be further developed for the purpose of increasing the accuracy from the 3 micron regime to the one-micron regime and below. In order to achieve these results, however, variations in some of the machining for the present embodiment are necessary. These changes, however, may have associated additional costs. For example, as opposed to using spherical bearing 50 of the present embodiment, a gas lubricating bearing may be used. A gas lubricating bearing provides lower friction and may be made more rigid than spherical bearing 50. Another change may be to substitute for glass scale encoders in the carriage 48 a laser interferometry positioning system that provides much finer raw resolution data. This could reduce the total error after all factors enter in the machine design. These can be further engineered to reduce errors associated with alignment, and still be clearly within the scope of the present invention.

Another change to the present embodiment may be to provide a device that programmably performs the necessary calculations and adjustments to centroid 90 of the interconnect array for flip chip device so that by way of programming, as opposed to machining, it is possible to change the centroid as a function of the positions of interconnect in the interconnect array.

OPERATION

Having described the components of the present embodiment, it is clear how they interact with one another to achieve the purposes of the present invention. However, for completeness the following description provides steps for calibration and use of the present embodiment that show further the inventive concepts of the present embodiment. For this purpose, an example of a flip chip device was accurately bonded to a substrate for a low temperature superconductivity experiment. Both interconnects 12 and corresponding wire pattern 14 were prepared with indium. The bonding process was estimated to require no more than 100° C. temperature at a pressure of at least 70 Kgm/cm$^2$ (10 Kpsi) applied to flip chip device 10. The flip chip device had 560 I/O pads each with area of 100×100 microns (0.004× 0.004 in). The force required to achieve the required pressure was calculated to be 45 Kgf (100 Lbf).

To achieve the desired results, one of the first steps is calibration of the present embodiment. To begin the calibration process, a dial indicator measuring device is positioned so as to indicate the position of the plane described by the bond head mounting plate 120, and adjustment screws 122 are adjusted to minimize the nutating action of bond head mounting plate 120. Bond head 42 is now placed onto theta stage device 44. The dial indicator is positioned so as to indicate the radial position of the outer cylindrical surface of upper spherical bond 50 of bond head 42. Ball-nose set screws 132 are now adjusted to minimize the radial deviation as indicated on the outer cylindrical surface of upper bearing race 56 of bond head 42. For calibration, the position of the upper camera is calibrated by manually aligning a transparent fiducial over the lower camera's cross hairs and then moving carriage 48 to move the cross hairs of upper camera 114 in alignment with this fiducial. The current position of carriage 48 at this point is taken to be the calibration point for the upper camera.

A radial target is then attached to theta stage device 44 in the place of flip chip device 10. This target has a fine cross hair fiducial at a radius of three inches from its center and another fiducial at its nominal center. The radial target is equipped with manual XY stages to allow for the visual conformation of the difference angle of the bond die from the rotational center. The radial target is rotated and translated so that three points can be digitized in a circular fashion. The center of a circle passing through these three points is calculated as the center of theta stage device 44. From this calculation center of rotation of theta stage device 44, and the measured center of upper camera 114, the relationship between upper camera 114 and bond head center is calculated. The next step is to rotate, as necessary, theta stage device 44 and observe the center fiducial so that it stays aligned with the cross hairs. The rotational center of theta stage device 44 is taken to be the center of bond head 42 as well.

Aligning a substrate to interconnects 12 on a flip chip device 10 is the next step. This can be done with knowledge of the calibrated position of the lower camera and the offset of the upper camera 114 to the rotational axis center line (which is also the center line of the bond head). The alignment digitizing process includes the sequence of positioning the upper camera over each fiducial on substrate 16 and digitizing their positions. The next steps are to hold the flip chip device 10 by a vacuum force to end effector 18 on bond head 42 and position the device over the lower camera to digitize the flip chip device 10 fiducial. The needed translation and rotational distances are then calculated from the digitized information and the positioning system is used to bring the device and substrate into XY alignment.

The present embodiment is designed to allow targeting of these points at the same nominal position of the Z-axis stage on the system. Targeting the alignment points at the same Z-axis position reduces the possibility of X and Y run-out of the Z-stage, which would otherwise introduce a misalignment in the final placement.

The preferred embodiment also includes a locking mechanism for the spherical bearing system so as to enable pre-planarizing the bond head end effector to the substrate prior to bonding the actual parts. Pre-planarizing the end effector to be within a small error of the nominal plane required for bonding keeps the amount of spherical rotation on the bearing system small and, in turn, helps reduce device skid or lateral misalignment during high force bonding.

At the start of a bonding session, bond head 42 will be pre-planarized with at least one qualification or test assembly. This qualification bond assembly either uses the actual devices and substrates to be a symbol or devices that are mechanically near as the actual devices as possible. In this qualification step, the device and substrate are digitized, as already stated and the device is positioned over at a slight Z elevation above the substrate bond. This Z position is called the "slow close height" and is the position at which the Z-axis will purposely be moved slowly as it approaches the device. At this time, the flip chip device 10 is pre-planarized to substrate 16 according to the following steps.

First, bond head 42 is slowly moved toward the substrate while load cell 96 is closely monitored. At this time, the lock is applied on the spherical bearing 50. Then, once the control algorithm reads a pre-set amount of force from the load cell 96, a lock on spherical bearing 50 is released as bond head 42 continues to travel toward the substrate 16 at a very slow rate. When a second threshold of force reading is obtained from the load cell 96, spherical bearing 50 is locked and bond head 42 is retracted from the device. Bond head 42 is thereby pre-planarized for a sample of the parts to be run. In subsequent bonding operations, the digitizing and planarizing sequence is similar to that explained above. This results in each bond cycle being pre-planarized by the previous bond cycle.

The present embodiment of the invention has numerous technical advantages. They include the use of a rigid four-post, large capacity, die set that minimizes deflection in the main structure of the machine. The present embodiment includes a self-planarizing bond head system that includes a spherical bearing system having the same three-dimensional center of rotation as that of the planar centroid of the interconnects on the flip chip device. A locking mechanism on this spherical bearing allows for pre-planarization. This minimizes planarization motion in the spherical bearing and, thus, the bond head system itself. The combination of the overall rigidity of the present embodiment together with the use of a lockable, compliant mechanism in the bond head helps to reduce post-bond device misalignment. Also, targeting the alignment points on both the flip chip device and the substrate at the same nominal position on the Z-axis provides yet a further technical advantage. That is, this form of targeting minimizes placement errors due to inaccuracies in the Z-axis stage. Furthermore, the design of a central force transmitting element in the bond head transmits the bonding force from the bond head to the load cell while providing a minimal amount of friction. The same mechanism allows for the adjustment of rotational axis run out in wobble errors to approximately zero. The design of the bonding interface component permits interchanging the bond head automatically, including connections for pneumatic, vacuum, electrical, and thermocouple interfaces. Yet a further technical advantage of the present embodiment is the feature of providing self-identifying bond heads.

The present embodiment provides passive planarization during the application of the pre-planarization and bonding force. Overall placement system costs are minimized by using the feature of digitized alignment points in the same plane. This feature takes advantage of most positioning systems nature of having a higher repeatability than accuracy. These and other technical advantages are inherent in the inventive concepts that the present embodiment employs.

In summary, therefore, the present invention provides a high force flip chip bonding method and system for precisely and forcefully engaging a flip chip device on a substrate while preventing lateral shifting therebetween. The method includes the steps of determining the centroid of the pattern formed by the interconnects on the flip chip device. In an alternative embodiment a predetermined point other than the centroid may be selected to achieve certain bonding results, A next step is to direct the flip chip device toward the substrate for contacting the corresponding wiring pattern with the interconnects. Then, the method steps include compressing the interconnects into the corresponding wiring pattern using a bonding force. The bonding force is directed along a neutral axis of deflection that is coincident with the centroid or other predetermined point. Applying the bonding force along the neutral axis of deflection at the centroid or other predetermined point minimizes lateral shifting of the flip chip device relative to the substrate to precisely bond the interconnects to the corresponding wiring pattern.

Although the invention has been described with reference to the above-specified embodiments, this description is not meant to be construed in a limiting sense. Various modifications of the disclosed embodiment, as well as alternative embodiments of the invention will become apparent to persons skilled in the art upon the reference to the above description. It is, therefore, contemplated that the appended claims will cover such modifications that fall within the true scope of the invention.

What is claimed is:

1. A method for precisely bonding interconnects of a flip chip device to a corresponding wiring pattern on a substrate, comprising the steps of:

determining the centroid of the pattern formed by the interconnects on the flip chip device;

directing the flip chip device toward the substrate for contacting the corresponding wiring pattern with the interconnects;

compressing the interconnects into the corresponding wiring pattern using a bonding force, the bonding force being directed along a neutral axis of deflection of a frame transmitting the bonding forced the neutral axis of deflection being coincident with the centroid, to minimize lateral shifting of the flip chip device relative to the substrate to precisely bond the interconnects to the corresponding wiring pattern; and electronically viewing the flip chip device and the substrate along the neutral axis of deflection for aligning the flip chip interconnects with the corresponding wiring pattern.

2. The method of claim 1, further comprising the steps of:

holding the flip chip device in a fixed position in the XY plane, and controlling the XY position of the substrate to precisely align the corresponding wiring pattern with the flip chip interconnects through the neutral axis of deflection.

3. The method of claim 1, further comprising the step of:

controlling rotational shifting of the flip chip device about the neutral axis of deflection to precisely align the flip chip interconnects with the corresponding wiring pattern and maintain the alignment during application of the bonding force.

4. The method of claim 1, further comprising the step of:

planarizing the flip chip device with the substrate to precisely align the flip chip interconnects with the corresponding wiring pattern in the X, Y, and Z planes, thereby applying a uniform pressure to each of the interconnects as well as preventing lateral shifting between the flip chip device and the substrate.

5. The method of claim 1, wherein said electronically viewing step further comprises the steps of:

electronically viewing a first predetermined aspect of the flip chip device and substrate using an upper camera;

electronically viewing a second predetermined aspect of the flip chip device and substrate using a lower camera; and directing the flip chip device toward the substrate in response to information desired from the combination of the upper camera and the lower camera.

6. The method of claim 1, further comprising the step of:

controlling the temperature of the flip chip device during the application of the bonding force to enhance bonding of the flip chip interconnects with the corresponding wiring pattern.

7. A method for precisely bonding interconnects of a flip chip device to a corresponding wiring pattern on a substrate, comprising the steps of:

determining the centroid of the pattern formed by the interconnects on the flip chip device;.

directing the flip chip device toward the substrate for contacting the corresponding wiring pattern with the interconnects;

compressing the interconnects into the corresponding wiring pattern using a bonding force, the bonding force being directed along a neutral axis of deflection of a frame transmitting the bonding force, the neutral axis of deflection being coincident with the centroid, to minimize lateral shifting of the flip chip device relative to the substrate to precisely bond the interconnects to the corresponding wiring pattern;

electronically viewing the flip chip device and the substrate along the neutral axis of deflection for aligning the flip chip interconnects with the corresponding wiring pattern;

planarizing the flip chip device with the substrate to precisely align the flip chip interconnects with the corresponding wiring pattern in the X, Y, and Z planes, thereby applying a uniform pressure to each of the interconnects as well as preventing lateral shifting between the flip chip device and the substrate; and locking the flip chip device in position after said planarizing step to maintain precise alignment of the flip chip interconnects with said corresponding wiring pattern during application of the bonding force.

8. A method for precisely bonding interconnects of a flip chip device to a corresponding wiring pattern on a substrate, comprising the steps of:

providing a predetermined position on the flip chip device;

directing the flip chip device toward the substrate to contact the corresponding wiring pattern with the interconnects;

compressing the interconnects into the corresponding wiring pattern using a bonding force, the bonding force being directed along a neutral axis of deflection of a frame transmitting the bonding force, the neutral axis of deflection being coincident with the predetermined position, to minimize lateral shifting of the flip chip device relative to the substrate to precisely bond the interconnects to the corresponding wiring pattern; and electronically viewing the flip chip device and the substrate along the neutral axis of deflection for aligning the flip chip interconnects with the corresponding wiring pattern.

9. The method of claim 8, further comprising the steps of:

holding the flip chip device in a fixed position in the XY plane, and controlling the XY position of the substrate to precisely align the corresponding wiring pattern with the flip chip interconnects through the neutral axis of deflection.

10. The method of claim 8, further comprising the step of:

controlling the rotational shifting of the flip chip device about the neutral axis of deflection to precisely align the flip chip interconnects with the corresponding wiring pattern and maintain the alignment during application of the bonding force.

11. The method of claim 8, wherein said electronically viewing step further comprises the steps of:

electronically viewing a first predetermined aspect of the flip chip device and substrate using an upper camera;

electronically viewing a second predetermined aspect of the flip chip device and substrate suing a lower camera; and directing the flip chip device toward the substrate in response to information derived form the combination of the upper camera and the lower camera.

12. The method of claim 8, further comprising the step of:

controlling the temperature of the flip chip device during the application of the bonding force to enhance bonding of the flip chip interconnects with the corresponding wiring pattern.

13. A method for precisely bonding interconnects of a flip chip device to a corresponding wiring pattern on a substrate, comprising the steps of:

providing a predetermined position on the flip chip device;

directing the flip chip device toward the substrate to contact the corresponding wiring pattern with the interconnects;

compressing the interconnects into the corresponding wiring pattern using a bonding force, the bonding force being directed along a neutral axis of deflection of a frame transmitting the bonding force, the neutral axis of deflection being coincident with the predetermined position, to minimize lateral shifting of the flip chip device relative to the substrate to precisely bond the interconnects to the corresponding wiring pattern;

electronically viewing the flip chip device and the substrate along the neutral axis of deflection for aligning the flip chip interconnects with the corresponding wiring pattern; and planarizing the flip chip device with the substrate to precisely align the flip chip interconnects with the corresponding wiring pattern in the X, Y, and Z planes, thereby applying a uniform pressure to each of the interconnects as well as preventing lateral shifting between the flip chip device and the substrate.

14. The method of claim 13, further comprising the step of:

locking the spherical bearing system after the planarizing step to maintain precise alignment of the flip chip interconnects with said corresponding wiring pattern during application of the bonding force.

* * * * *

UNITED STATES PATENT AND TRADEMARK OFFICE
CERTIFICATE OF CORRECTION

PATENT NO. : 5,462,217

DATED : October 31, 1995

INVENTOR(S) : Simmons, et al.

It is certified that error appears in the above-identified patent and that said Letters Patent is hereby corrected as shown below:

Column 12, line 36, after "the bonding" delete "forced" and insert -- force, --.

Column 13, line 17, after "device", delete ";." and insert -- ; --.

Signed and Sealed this

Twenty-sixth Day of March, 1996

Attest:

BRUCE LEHMAN

Attesting Officer

Commissioner of Patents and Trademarks